United States Patent [19]

Sakui et al.

[11] Patent Number: 4,763,178
[45] Date of Patent: Aug. 9, 1988

[54] SEMICONDUCTOR MEMORY DEVICE

[75] Inventors: Koji Sakui, Tokyo; Mitsugi Ogura, Yokohama, both of Japan

[73] Assignee: Tokyo Shibaura Denki Kabushiki Kaisha, Kawasaki, Japan

[21] Appl. No.: 928,694

[22] Filed: Nov. 7, 1986

Related U.S. Application Data

[63] Continuation of Ser. No. 515,670, Jul. 20, 1983, abandoned.

[30] Foreign Application Priority Data

Jul. 28, 1982 [JP] Japan ................... 57-131567

[51] Int. Cl.[4] ........................... H01L 29/78
[52] U.S. Cl. ................... 357/23.6; 357/45; 365/174; 365/182
[58] Field of Search ............. 357/23.6, 45, 41; 365/174, 182

[56] References Cited

U.S. PATENT DOCUMENTS 4,419,682 12/1983 Masuoka .............. 357/23.6

FOREIGN PATENT DOCUMENTS 5541754 9/1978 Japan .................... 357/23.6

OTHER PUBLICATIONS

Patents Abstracts of Japan, vol. 4, No. 75 (E-13) [557] May 31, 1980, p. 19 E 13.
IBM Technical Disclosure Bulletin, vol. 24, No. 7B, Dec. 1981, pp. 3815-3816, Armonk, N.Y., U.S.

Primary Examiner—Andrew J. James
Assistant Examiner—Mark Prenty
Attorney, Agent, or Firm—Oblon, Fisher, Spivak, McClelland & Maier

[57] ABSTRACT

A dynamic random access memory is disclosed which has memory cell units formed on a silicon substrate, each of which includes four memory cells, each of these including a MOS transistor and a MOS capacitor. One cell unit occupies a substantially square area of the surface of the substrate. The four memory cells included in this cell unit are arranged along the diagonal lines of the square area in the shape of a cross. The four transistors are connected to a common drain through a common drain region. The capacitors are respectively arranged at the four corners of the square area so as to have a relatively increased capacitor area, thereby obtaining a large capacitance.

11 Claims, 7 Drawing Sheets

SEMICONDUCTOR MEMORY DEVICE

This applicaiton is a continuation of application Ser. No. 515,670, filed July 20, 1983 and now abandoned.

BACKGROUND OF THE INVENTION

1. Field of the Invention

The present invention relates in general to semiconductor memory devices and, in particular, to a semiconductor memory device having a plurality of memory cells each bit of which comprises a MOS transistor and a MOS capacitor.

2. Discussion of Background

In a dynamic random access memory (dynamic RAM) having one-bit memory cells each of which comprises a metal oxide semiconductor (MOS) transistor and a MOS capacitor, digital storage data is stored in the MOS capacitor by means of charging or discharging thereof. The amount of charge in the MOS capacitor of the memory cell largely determines the performance of the dynamic RAM. The charge Q of the MOS capacitor is given as follows:

$$Q = CV$$

where C is the capacitance of the MOS capacitor and V is the write voltage. Thus, when the write voltage V is decreased, the charge Q is proportionally decreased. In order to compensate for the decrease in charge, the capacitance C must be increased.

In order to increase the capacitance C, (i) the area of the conductors of the capacitor must be increased, (ii) the thickness of an insulating film as a dielectric must be reduced, and/or (iii) an insulating film having a large dielectric constant must be used. However, in order to increase the area of the conductors, the chip size of the dynamic RAM is increased in accordance with the same design rule, decreasing the product yield and increasing the manufacturing cost. On the other hand, when the thickness of the insulating film is greatly reduced, the dielectric withstand voltage of the element is decreased, resulting in degradation of element reliability. Although an $Si_3N_4$ film, which has a dielectric constant twice that of an $SiO_2$ film, is currently receiving a great deal of attention as an insulating film, the manufacturing process becomes complicated when this film is used and a large leakage current occurs, which degrades industrial applicability. Furthermore, no other insulating film suitable for use with the present silicon film formation techniques has yet been proposed.

SUMMARY OF THE INVENTION

It is an object of the present invention to provide a new and improved semiconductor memory device wherein the charge stored in a one-bit memory cell can be increased without increasing the memory chip size or modifying the basic manufacturing process of the memory device.

According to the present invention, a plurality of memory cells included in a memory device are grouped into cell groups or cell units in predetermined units of cells. As will be illustrated in a preferred embodiment, each cell unit includes four memory cells, each of which has a switching transistor and a capacitor. Each cell unit has a predetermined rectangular area of a surface of a semiconductor substrate. The memory cells included in each cell unit are radially arranged using as a center an intersection of diagonal lines of the predetermined rectangular area. Transistors such as MOS transistors of these cells are connected to each other through a semiconductor layer which is formed at the intersection of the diagonal lines of the predetermined rectangular area and which serves as a common drain region for all transistors included in each cell unit. Capacitors such as MOS capacitors directly connected to these transistors, respectively, are formed to have a relatively large area in the peripheral portions within the predetermined rectangular area.

BRIEF DESCRIPTION OF THE DRAWINGS

The present invention is best understood by reference to the accompanying drawings, in which.

DETAILED DESCRIPTION OF THE PREFERRED EMBODIMENT

Figure 1:
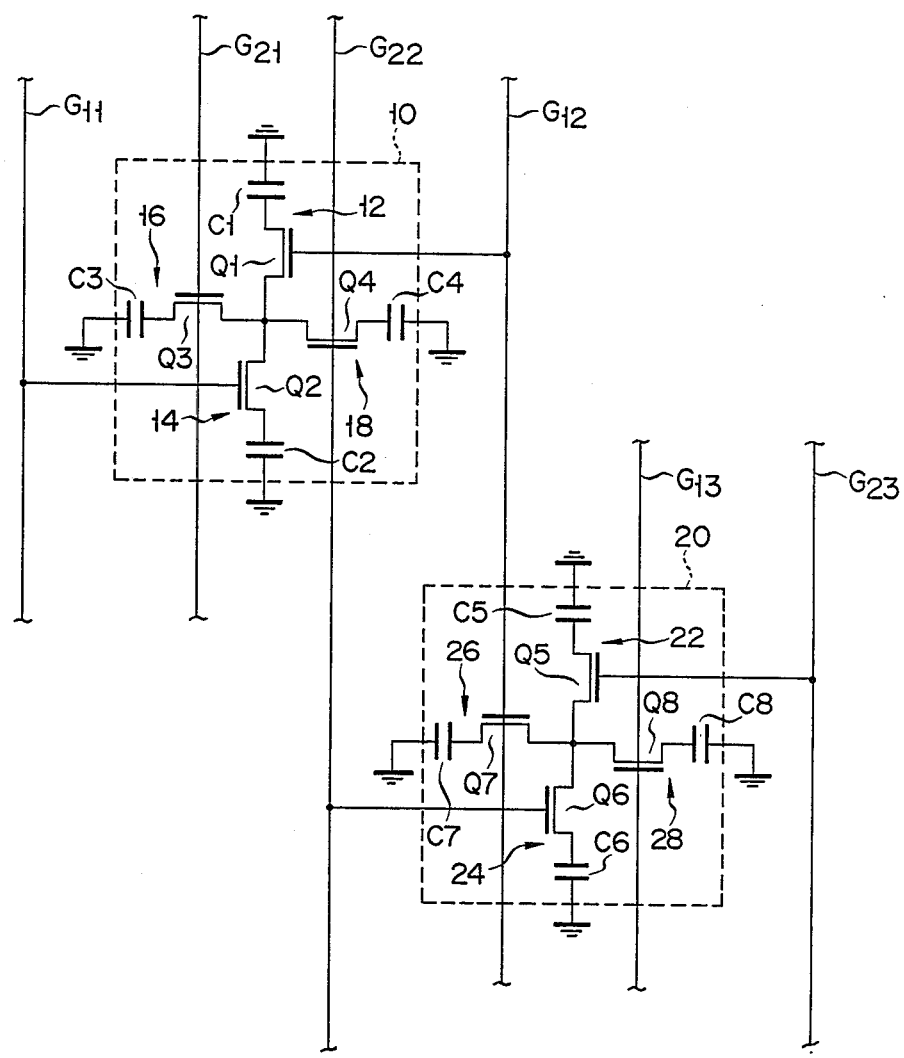
FIG. 1 is a circuit diagram showing two cell units each including four cells in a dynamic memory device according to an embodiment of the present invention.

Referring now to FIG. 1, an equivalent circuit of a memory cell structure of a dynamic memory such as a dynamic random access memory (dRAM) according to an embodiment of the present invention is illustrated. A first cell unit or cell group 10 includes four memory cells 12, 14, 16 and 18 each of which comprises a MOS transistor Q and a MOS capacitor C. The MOS transistors Q1, Q2, Q3 and Q4 are arranged radially or in the shape of a cross. The drain electrodes of the MOS transistors Q1 to Q4 are commonly connected. A second cell unit 20 adjacent to the first cell unit 10 also has four memory cells 22, 24, 26 and 28, each of which comprises a MOS transistor Q and a MOS capacitor C. The MOS transistors Q5, Q6, Q7 and Q8 included in the adjacent cell unit 20 are commonly connected to one another at their drain electrodes in substantially the same manner as in the cell unit 10. It should be noted that the memory cells 12 and 14 in the first cell unit 10 extend and oppose each other in the same direction as do the memory cells 22 and 24 in the second cell unit 20. Similarly, it should also be noted that the memory cells 16 and 18 in the first cell unit 10 extend and oppose each other in the same direction as do the memory cells 26 and 28 in the second cell unit 20 on a plane parallel to the substrate.

Gate electrode wiring lines G are provided to connect the MOS transistors Q. First lines $G_1$ (i.e., $G_{11}$, $G_{12}$, . . . ) are formed in a first wiring pattern layer formed on the substrate. Second lines $G_2$ (i.e., $G_{21}$, $G_{22}$, . . . ) are formed in a second wiring pattern layer formed on the first wiring pattern layer. The gates of the MOS transistors Q1 and Q2 oppose each other along a direction parallel to the lines G and are connected to first lines $G_{12}$ and $G_{11}$ of the first wiring pattern, respectively. The gates of the MOS transistors Q3 and Q4 opposing each other along a direction perpendicular to the lines G are connected to second lines $G_{21}$ and $G_{22}$ of the second wiring pattern layer. In the second cell unit 20 adjacent to the first cell unit 10, the manner of gate connection is different from that in the cell unit 10. It should be noted that the lines $G_1$ are not connected to the gates of the transistors Q5 and Q6 which oppose each other in a direction parallel thereto but to the gates of the transistors Q7 and Q8 which oppose each other in a direction perpendicular thereto. The gates of the transistors Q5 and Q6 are connected to the lines $G_{22}$ and $G_{23}$ of the second wiring pattern layer.

Figure 2:
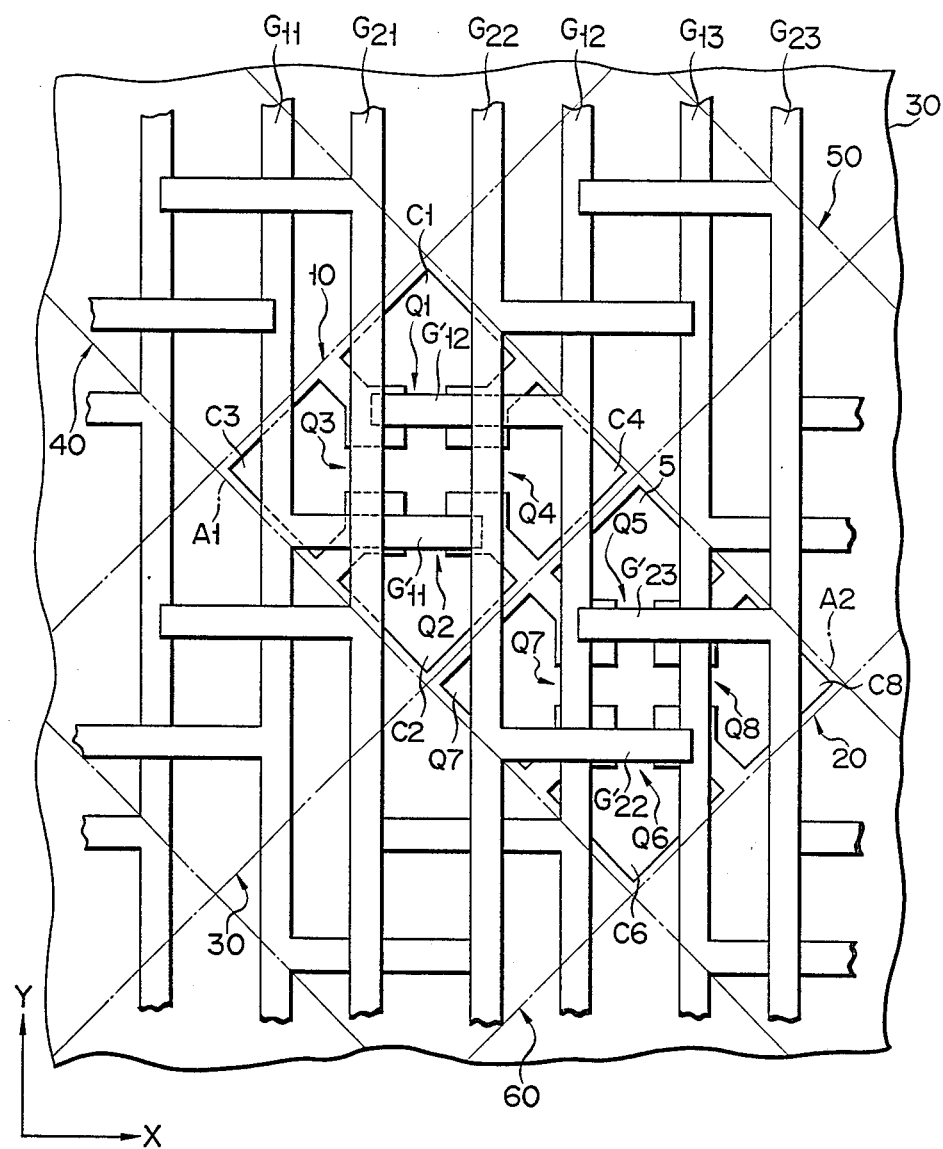
FIG. 2 is a plan view showing the pattern including cell units (FIG. 1) formed on a semiconductor substrate.

In order to best disclose the memory cell arrangement of the present invention, a plan view of the dynamic memory device is illustrated in FIG. 2. The memory cell units 10, 20, 30, 40, 50, 60, . . . , are integrated and formed on a semiconductor substrate such as a monocrystalline silicon substrate 30 of one conductivity type, for example, p-type. In FIG. 2, the four MOS transistors Q1 to Q4 included in the cell unit 10 are commonly connected at their drains to the central portion of a square substrate surface area or cell unit area A1 surrounded by the alternate long and short dashed line. In other words, a single diffusion layer (denoted by reference numeral 120 in FIGS. 12 and 13) formed at the central portion of the surface area (cell unit area) A1 serves as the common drain of the four MOS transistors Q1 to Q4 in the cell unit 10. The four transistors Q1 to Q4 are arranged in the shape of a cross having as its center the central portion or the common drain region of the area A1. The transistors Q1 and Q2 oppose each other so as to extend along the lines G (i.e., in the Y direction), while the transistors Q3 and Q4 oppose each other so as to extend along a line (i.e., in the X direction) perpendicular to the lines G on the substrate 30. It should be noted that the square cell unit area A1 is thus rotated through an angle, preferably about 45° about the center thereof with respect to the X-Y coordinate system. Therefore, the two diagonal lines of the cell unit area A1 are parallel to the X and Y directions, respectively. The four capacitors C1 to C4 included in the cell unit 10 are formed at the four corners of the square cell unit area A1, respectively. The four capacitors C1 to C4 are formed in the shape of a cross in the same manner as the transistors Q so as to oppose the capacitors C1 and C2 along the Y direction and the capacitors C3 and C4 along the X direction. Therefore, the transistor-capacitor arrangement is symmetrical about the diagonal lines of the square cell unit area 10. The second cell unit 20 adjacent to the lower right side of the cell unit 10 in FIG. 2 has substantially the same cell unit arrangement as described above.

The first gate wiring lines $G_{11}$, $G_{12}$, . . . are provided above the structure and are electrically insulated from the structure. The first lines $G_{11}$, $G_{12}$, . . . comprise polycrystalline silicon. The first lines $G_{11}$, $G_{12}$, $G_{13}$, . . . basically extend along the Y direction in FIG. 2. For example, the lines $G_{11}$ and $G_{12}$ extend along the Y direction so as to include the four transistors Q1 to Q4 in the first cell unit 10 therebetween. Branch lines $G_{11}'$ and $G_{12}'$ extending into the cell unit 10 along the X direction from the first gate wiring lines $G_{11}$ and $G_{12}$, respectively, are connected to the gates of the transistors Q2 and Q1 opposing each other along the Y direction, respectively. At the same time, the line $G_{12}$ is connected to the gate of the transistor Q7 included in the second cell unit 20. The gate of the transistor Q8 opposing the transistor Q7 in the cell unit 20 along the X direction is connected to another first gate wiring line $G_{13}$.

The second gate wiring lines (formed in the second wiring pattern layer) $G_{21}$, $G_{22}$, $G_{23}$, . . . basically extend along the Y direction so as to overlie the first gate electrode wiring lines $G_1$, and are electrically insulated therefrom. The gates of the transistors Q3 and Q4 (of the first cell unit 10) opposing each other along the X direction are connected to the lines $G_{21}$ and $G_{22}$, respectively. However, the gates of the transistors Q5 and Q6 (of the second cell unit 20) opposing each other along the Y direction are connected to the lines $G_{23}$ and $G_{22}$, respectively. A branch line $G_{22}'$ extending in the X direction from the second line $G_{22}$ connected to the transistor Q4 is connected to the transistor Q6 of the second cell unit 20. The transistor Q5 of the second cell unit 20 which opposes the transistor Q6 along the Y direction is connected to the second line $G_{23}$ through a branch line $G_{23}'$. The above gate connection technique is repeated between every two adjacent cell units. Referring to FIG. 2, the same gate connection technique as used in the second cell unit 20 is used for the three cell units 30, 40 and 50 which are each adjacent to the cell unit 10. However, the same gate connection technique as used in the first cell unit 10 is used for cell units (a cell unit 60, for example) which are adjacent to the cell units 20, 30, 40 and 50.

According to the present invention, therefore, the memory cells included in the dynamic memory are grouped in units of four memory cells, and the drain electrodes of the four MOS transistors of each memory cell are commonly connected by a single drain region. As a result, the contact region for an aluminum or platinum wiring pattern can be greatly decreased (to substantially one-fourth of its prior value). Furthermore, each cell unit is defined by the square region such that the four memory cells therein are radially arranged in the shape of a cross (i.e., along the diagonal lines of the square). At the same time, the four capacitors (e.g., C1, C2, C3 and C4) respectively included in the four memory cells are located at the four corners of the square. The transistor-capacitor pairs are symmetrical about the diagonal lines of the square, respectively. Therefore, in each of the cell units, the effective area of the four capacitors connected outside the four transistors arranged in the shape of a cross within the cell unit can be greatly increased. As a result, a high-performance dynamic memory can be obtained without increasing the memory chip size, without changing the general LSI design rule, and without modifying the basic manufacturing process.

The steps of manufacturing the semiconductor memory device of the above embodiment will now be described to further clarify the unique pattern configuration of the device.

Figure 3:
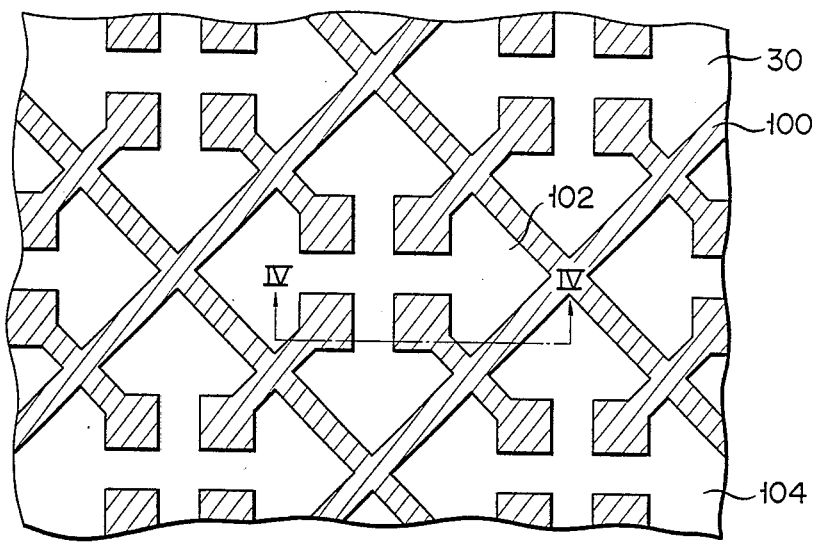
FIGS. 3, 5, 7, 9 and 11 illustrate, in schematic plan view, some of the major steps in the formation of the dynamic memory having the cell units of FIGS. 1 and 2 of the present invention.
Figure 4:
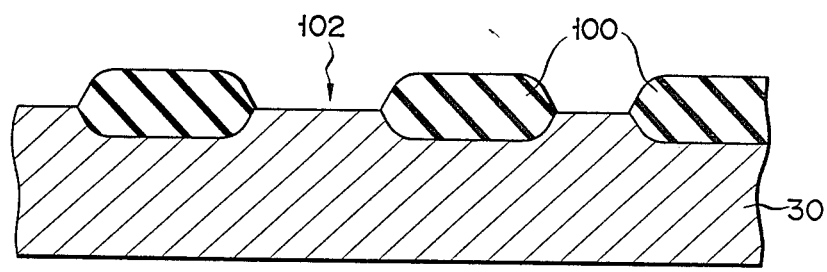
FIGS. 4, 6, 8, 10, 12 and 13 illustrate, in schematic cross section, the main parts of the memory structures shown in FIG. 3, 5, 7, 9 and 11, respectively.

Referring to FIG. 3, a field insulating layer 100 (hatched area for illustrative convenience) which is patterned as shown in the figure, is formed on the surface of the p-type silicon substrate 30 using a known selective oxidation technique or the like. The field insulating layer 100 defines the cell unit areas in each of which four memory cells are to be formed. Due to this field insulating layer 100, cell unit element formation regions including element formation regions 102 and 104 of the cell units 10 and 20, respectively, are exposed on the surface of the substrate 30. The profile of the structure (FIG. 3) along the line IV—IV is illustrated in FIG. 4.

Figure 5:
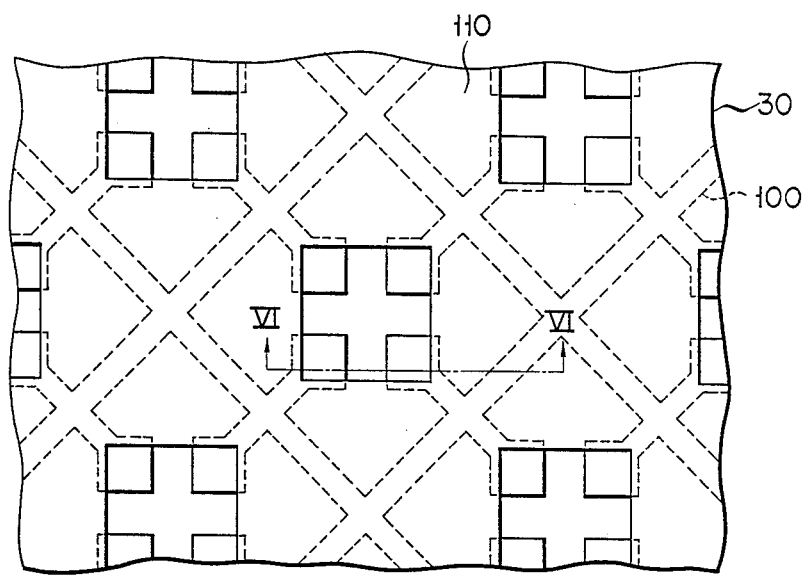

First gate insulating oxide films 108 are formed on the element formation regions 102, 104, . . . corresponding to the cell unit areas of the structure shown in FIG. 3. A first polycrystalline silicon film is then deposited on the gate insulating films 108 and is patterned to form a MOS capacitor electrode film 110 having a pattern as shown in FIG. 5. The MOS capacitor electrode film 110 is common to all capacitors in the structure. The MOS capacitor electrode film 110 is set at a predetermined potential (e.g., ground potential) for all bits of the dynamic memory. The profile of the resultant structure (FIG. 5) along the line VI—VI is illustrated in FIG. 6.

Figure 6:
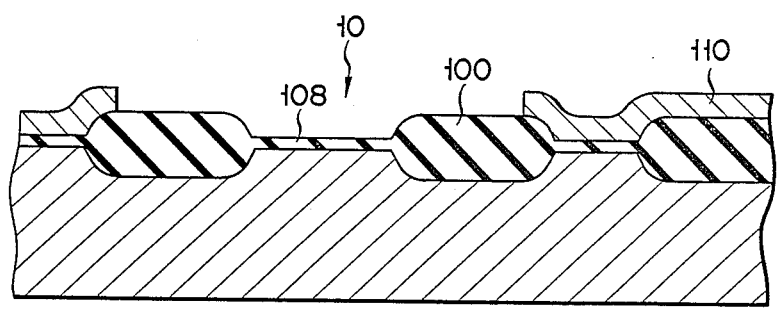
Figure 7:
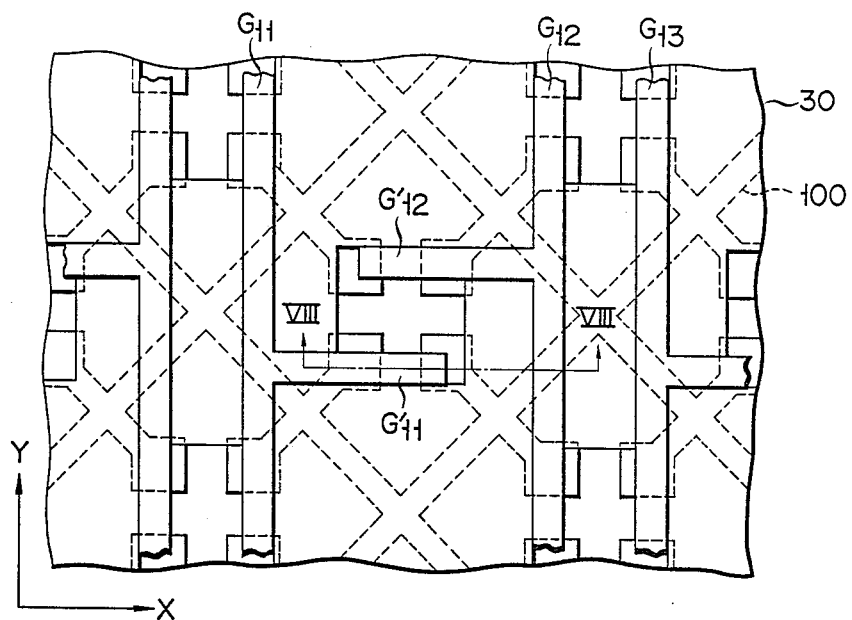
Figure 8:
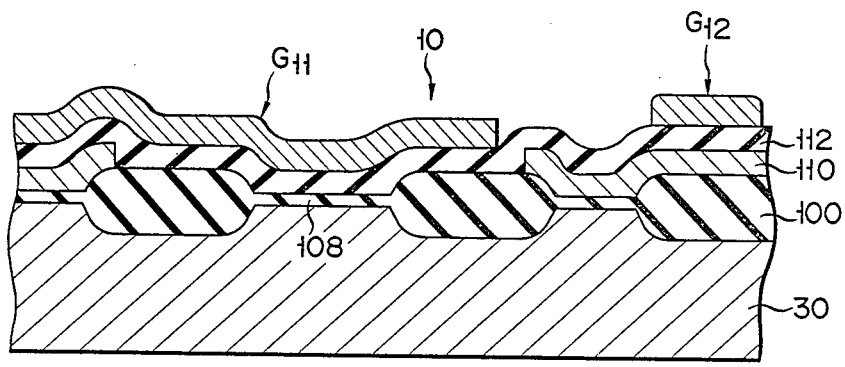

Thereafter, a second gate insulating oxide film 112 is deposited, as shown in FIG. 8, to cover the entire surface of the structure shown in FIGS. 5 and 6. A second polycrystalline silicon film is then deposited on the second gate insulating oxide film 112 and is patterned to form the first gate electrode wiring lines $G_{11}$, $G_{12}$, ... having the surface pattern shown in FIG. 7. (In FIG. 7, the oxide film 112 is omitted only for illustrative convenience.) The lines $G_{11}$, $G_{12}$, ... serve as word lines of the dynamic memory and extend substantially along the Y direction. The lines $G_{11}$ and $G_{12}$ have branch lines $G_{11}'$ and $G_{12}'$ which are connected to the gate electrodes of the MOS transistors Q1 and Q2 included in the cell unit 10 (FIG. 2), respectively. The connections between the lines $G_{11}$, $G_{12}$, $G_{13}$, ... and the transistors Q have already been described with reference to FIGS. 1 and 2. The profile of the structure (FIG. 7) along the line VIII—VIII is illustrated in FIG. 8.

Figure 9:
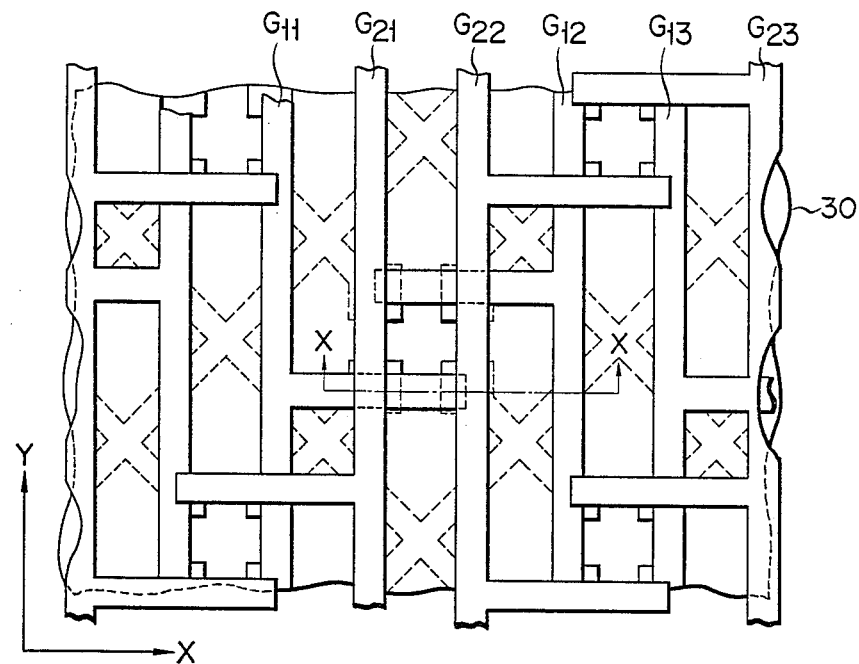
Figure 10:
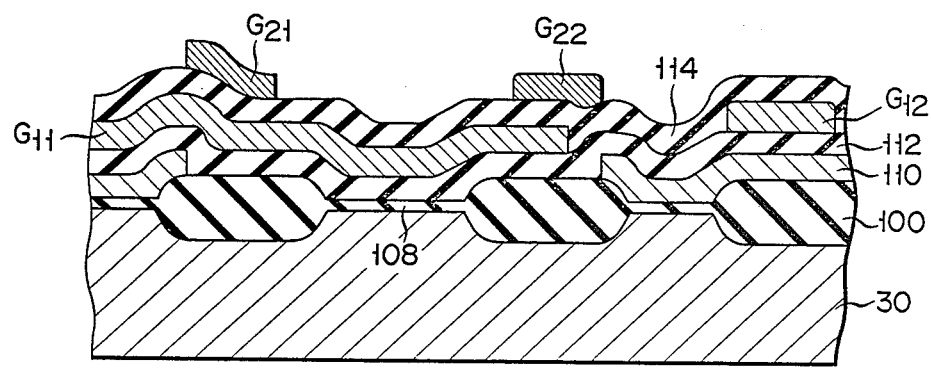
Figure 11:
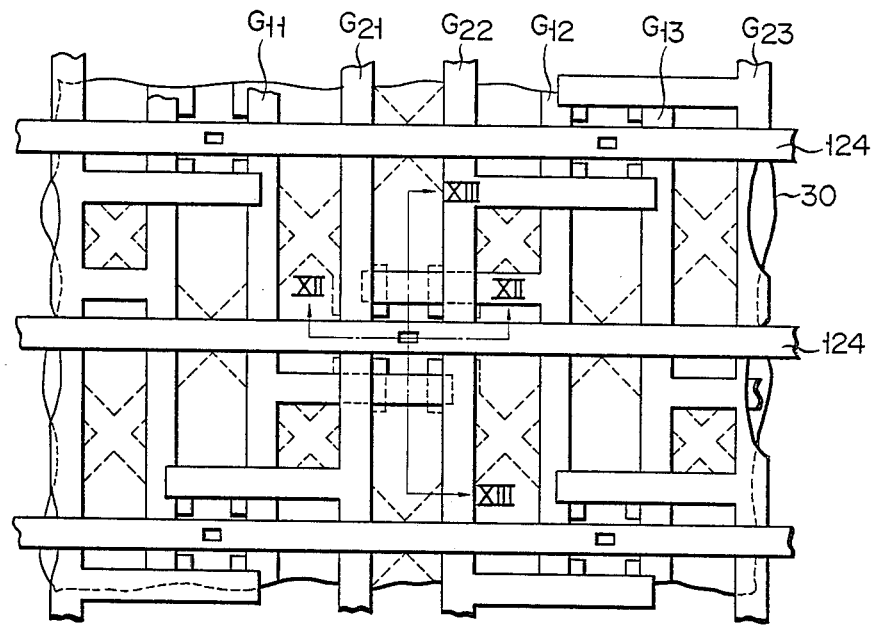

Subsequently, a third gate insulating oxide film 114 is deposited, as shown in FIG. 10, to cover the entire surface of the structure shown in FIGS. 7 and 8. A third polycrystalline silicon film is deposited on the third gate insulating oxide film 114 and is patterned to obtain the second gate electrode wiring lines $G_2$ (i.e., $G_{21}$, $G_{22}$, $G_{23}$, ...). These lines $G_{21}$, $G_{22}$, $G_{23}$, ... extend substantially along the Y direction. The connections between the second lines $G_{21}$, $G_{22}$, $G_{23}$, ... and the transistors Q have already been described with reference to FIGS. 1 and 2, and a detailed description thereof will be omitted. The profile of the resultant structure (FIG. 9) along the line X—X is illustrated in FIG. 10.

Figure 12:
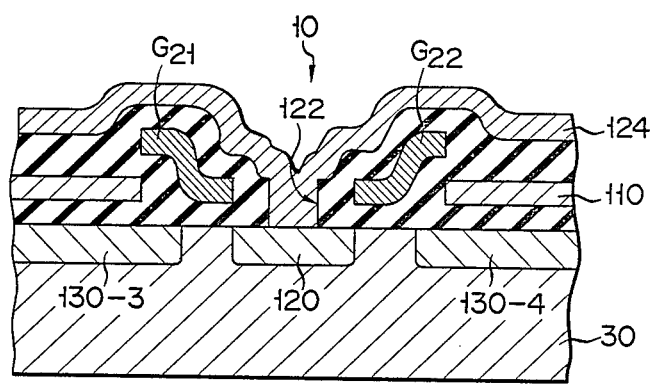
Figure 13:
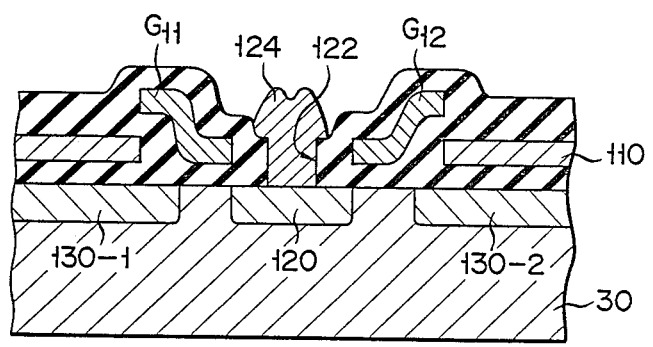

An impurity is diffused into the central portion of the cell unit region by a known diffusion technique to form a common drain layer 120 for the four transistors (e.g., Q1, Q2, Q3 and Q4 in the cell unit 10) included in each cell unit. Thereafter, a CVD-SiO$_2$ film is deposited on the structure (FIGS. 9 and 10), and a contact hole 122 is formed at the center of each cell unit region as shown in FIG. 12. An aluminum line 124 is then deposited on the CVD-SiO$_2$ film to extend along the X direction. The aluminum line 124 serves as the digit line. The aluminum line 124 is electrically connected to the common drain layer (diffusion layer) 120 through the contact hole 122. A protective film (not shown) is deposited to cover the entire surface of the resultant structure, thereby preparing a dynamic memory. It should be noted that, in FIGS. 12 and 13, reference numerals 130-1, 130-2, 130-3 and 130-4 denote active regions or n$^-$-type diffusion layers of the four MOS capacitors C1, C2, C3 and C4 included in the cell unit 10.

The effects of the semiconductor memory device of the above embodiment will be described in detail again. Since the four memory cells are connected to the digit line through the single node (contact), the area of the MOS capacitor in each cell can be increased. In particular, as compared with the conventional structure wherein two memory cells use one node, the area of the contact and the like in each memory cell of the device of this embodiment is decreased by 50%, thus providing the following advantages to the dynamic RAM.

First, a stray capacitance of the digit line which is caused by a junction capacitance is decreased, and the capacitor area is increased. In a conventional memory area, a digit line capacitance Cp is about 600 fF which includes the junction capacitance of 150 fF ($150 \times 10^{-15}$ F). The cell capacitance Cs is 45 fF. Therefore, the ratio Cp/Cs is 13.3. However, in the memory cell of the present invention, the junction capacitance is decreased to 75 fF, the digit line capacitance $C_p$ is 525 fF, and the cell capacitance Cs is increased to 55 fF. Therefore, the ration Cp/Cs is decreased to 9.5.

Second, soft errors can be eliminated. A soft error is defined as an error in which a signal stored in the capacitor of the cell is inverted and the sense amplifier is erroneously operated since the alpha-rays from a small amount of radioactive material included in a package or a semiconductor irradiate the diffusion layer of the memory cell and the digit line. In the memory cell of the present invention, however, since the capacitance of the memory cell is increased to store a larger amount of charge, the inversion of the signals in the capacitance can be effectively prevented. The semiconductor memory device of this embodiment is very effective in preventing erroneous operation of the sense amplifier by increasing the withstand voltage, since the area of the diffusion layer connected to the single digit line is small.

Third, since the area of the MOS capacitors for the single cell region is increased, a large signal can be obtained at the digit line, thereby greatly improving the S/N ratio. As a result, a highly reliable RAM can be obtained. Furthermore, since the S/N ratio is increased, the margin with respect to a sense refresh amplifier is improved, so that the sense circuit system can be easily designed. In addition to this advantage, the product yield is increased, and the manufacturing cost may be decreased.

Fourth, if the S/N ratio is set at a given value, the amount of charge is set at another given value. Therefore, the capacitance of the capacitor can be decreased. For this reason, a compact memory cell can be obtained, so that the chip size of the RAM can be decreased. When the chip size is decreased, the number of devices obtained from a single wafer is increased. As a result, the chip material cost is decreased. Furthermore, the IC mask pattern can be designed with a wide range of margin since the capacitor size is decreased. Therefore, the product yield is increased.

Although the present invention has been shown and described with respect to a particular embodiment, various changes and modifications which are obvious to a person skilled in the art to which the invention pertains are deemed to lie within the spirit and scope of the invention.

For example, a fourth polycrystalline silicon film may be used for the digit line in place of the aluminum wiring layer. Alternatively, for this purpose, a low-resistivity material such as a high-melting point material, such as molybdenum or a silicide thereof, may be used. In this case, portions of the second and third polycrystalline silicon layers (used as the gate electrodes of the MOS transistors) which extend along the Y direction, excluding the gate region, may be formed by an aluminum film, a high-melting point metal such as molybdenum, or a silicide such as an aluminum silicide or a molybdenum silicide. Furthermore, the second and third polycrystalline silicon layers are formed in the same manner as in the embodiment, and an aluminum wiring layer may be deposited thereon to selectively contact the second and third polycrystalline silicon layers.

What is claimed is:

1. A semiconductor memory device comprising:
   a semiconductor substraste having a surface and a first conductivity type;
   a plurality of cell groups which are formed on said substrate in such a manner that each group has a group area of a substantially square shape upon the substrate surface and includes four memory cells each having a switching transistor and a capacitor and a single semiconductor layer of a second conductivity type serving as a common drain region for all transistors included therein, said four memory cells being respectively positioned at four corners of the square-shaped cell area such that the area of the switching transistor and of the capacitor of one memory cell is symmetrical with the area of the switching transistor and of the capacitor of the diagonally associated memory cell; and
   parallel gate wiring lines which are electrically connected to gates of transistors included in said cell groups,
   said gate wiring lines being formed in first and second stacking wiring pattern layers which are provided over said substrate, and
   said square-shaped cell area being arranged on said substrate in such a manner as to be positioned aslant the extending direction of said gate wiring lines by substantially forty-five degrees.

2. The device according to claim 1, further comprising:
   a conductive layer provided above said substrate to serve as a common capacitor electrode for all capacitors of said memory device, said conductive layer also being made of polycrystalline semiconductor material.

3. The device according to claim 1, wherein said one cell group includes first to fourth memory cells which respectively have first to fourth transistors, said first to fourth transistors being connected to each other through said semiconductor layer as a common drain region formed at an intersection between first and second diagonal lines of said predetermined area and being arranged along the first and second diagonal lines in a cross-shape, said first and second cells opposing each other and said third and fourth cells opposing each other.

4. The device according to claim 3, wherein said first to fourth cells respectively have first to fourth capacitors, said first and second capacitors being respectively connected directly to said first and second transistors opposing each other along the first diagonal line and being arranged at first and second corners corresponding to the first diagonal line of said predetermined area, and said third and fourth capacitors being respectively connected directly to said third and fourth transistors opposing each other along the second diagonal line and being arranged at third and fourth corners corresponding to the second diagonal line of said predetermined area.

5. The device according to claim 4, further comprising:
   a first conductive layer which is provided above said substrate so as to be electrically insulated therefrom and which serves as a common capacitor electrode for all the capacitors of said memory device, said all the capacitors including said first to fourth capacitors included in said one cell group;
   a second conductive layer which is provided above said first conductive layer so as to be electrically insulated therefrom and which includes first gate electrode lines respectively connected to gates of said first and second transistors; and
   a third conductive layer which is provided above said second conductive layer so as to be electrically insulated therefrom and which includes second gate electrode lines respectively connected to gates of said third and fourth transistors.

6. The device according to claim 5, wherein said first to third conductive layers comprise a polycrystalline silicon material.

7. The device according to claim 5, further comprising:
   a fourth conductive layer which is provided above said third conductive layer so as to be insulated therefrom and which includes a drain electrode line connected to said common drain region of said first to fourth transistors.

8. A dynamic random access memory comprising:
   a semiconductive substrate of a first conductivity type having a surface;
   square-shaped cell units formed on said substrate in such a manner that each cell unit includes four memory cells which are respectively positioned at four corners thereof, and each of which has a switching transistor and a capactior positioned in a cell area whose planar shape is symmetrical with that of the diagonally associated memory cell, and a single semiconductor layer of a second conductivity type serving as a common drain region for all transistors included therein; and
   parallel conductive gate wiring lines which are electrically connected to gates of transistors included in said cell units,
   said gate wiring lines being formed in first and second stacking wiring pattern layers which are provided over said substrate, and
   each of said square-shaped cell units being positioned on said substrate aslant the extending direction of said gate wiring lines in such a manner that a first pair of memory cells consisting of two cells diagonally associated therein are aligned in parallel with said gate wiring lines, and a second pair of memory cells consisting of the remaining two cells diagonally associated therein are aligned perpendicular to said wiring lines.

9. The memory according to claim 8, wherein said gate wiring lines include:
   first gate wiring lines having branch line portions which extend in parallel with said second pair of memory cells in each of said square-shaped cell units, said branch line portions being connected to the transistors of said first pair of memory cells; and
   second gate wiring lines connected to the transistors of said second pair of memory cells.

10. The memory according to claim 9, wherein said first gate wiring lines are formed in said first wiring pattern layer, and wherein said second gate wiring lines are formed in said second wiring pattern layer which is stacked over said first wiring pattern layer.

11. The memory according to claim 10, wherein said square-shaped cell units are positioned on said substrate aslant the extending direction of said gate wiring lines by substantially forty-five degrees.

* * * * *